United States Patent
Miura et al.

(10) Patent No.: US 12,040,012 B2
(45) Date of Patent: Jul. 16, 2024

(54) SEMICONDUCTOR DEVICE HAVING BUFFER CIRCUIT

(71) Applicant: MICRON TECHNOLOGY, INC., Boise, ID (US)

(72) Inventors: Yuki Miura, Sagamihara (JP); Ken Ota, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 17/814,154

(22) Filed: Jul. 21, 2022

(65) Prior Publication Data
US 2024/0029783 A1  Jan. 25, 2024

(51) Int. Cl.
| | | |
|---|---|---|
| G11C 11/40 | (2006.01) | |
| G11C 11/4093 | (2006.01) | |
| G11C 11/4096 | (2006.01) | |
| G11C 29/52 | (2006.01) | |

(52) U.S. Cl.
CPC ...... *G11C 11/4093* (2013.01); *G11C 11/4096* (2013.01); *G11C 29/52* (2013.01)

(58) Field of Classification Search
None
See application file for complete search history.

(56) References Cited

U.S. PATENT DOCUMENTS

| | | | | |
|---|---|---|---|---|
| 2012/0030414 A1* | 2/2012 | Jo | ........................ | G06F 13/1673 |
| | | | | 711/E12.008 |
| 2014/0258811 A1* | 9/2014 | Liu | ..................... | G06F 11/1008 |
| | | | | 714/766 |
| 2020/0125443 A1* | 4/2020 | Hung | ..................... | G11C 16/08 |

* cited by examiner

*Primary Examiner* — Tan T. Nguyen
(74) *Attorney, Agent, or Firm* — Dorsey & Whitney LLP

(57) ABSTRACT

Disclosed herein is an apparatus that includes: first and second memory groups including a plurality of first and second memory cells, respectively; a first buffer circuit configured to receive a plurality of first data bits from the first memory group; a second buffer circuit configured to receive a plurality of second data bits from the second memory group; a first error correction circuit configured to correct at least one of the plurality of first data bits; and a second error correction circuit configured to correct at least one of the plurality of second data bits. The first error correction circuit is arranged between the first and second buffer groups of the first buffer circuit in physical layout. The second error correction circuit is arranged between the third and fourth buffer groups of the second buffer circuit in physical layout.

20 Claims, 4 Drawing Sheets

SEMICONDUCTOR DEVICE HAVING BUFFER CIRCUIT

BACKGROUND

A semiconductor memory device such as a DRAM (Dynamic Random Access Memory) includes a buffer circuit that transfers data between a memory cell array and an I/O (Input/Output) circuit. There is a case where the buffer circuit is divided into an ODD buffer circuit to be allocated to a memory bank accessed at a certain timing and an EVEN buffer circuit to be allocated to a memory bank accessed at another timing Each of the ODD buffer circuit and the EVEN buffer circuit is composed of a plurality of unit buffer circuits to which different addresses are respectively allocated. The unit buffer circuits constituting the ODD buffer circuit and the unit buffer circuits constituting the EVEN buffer circuit are alternately arrayed in one direction in some cases to simplify coupling to a different buffer circuit arranged in the memory cell array. However, this layout has a problem that an area occupied by a control circuit controlling the buffer circuits is increased and that wiring lengths of lines that connect the buffer circuits to the control circuit are elongated.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
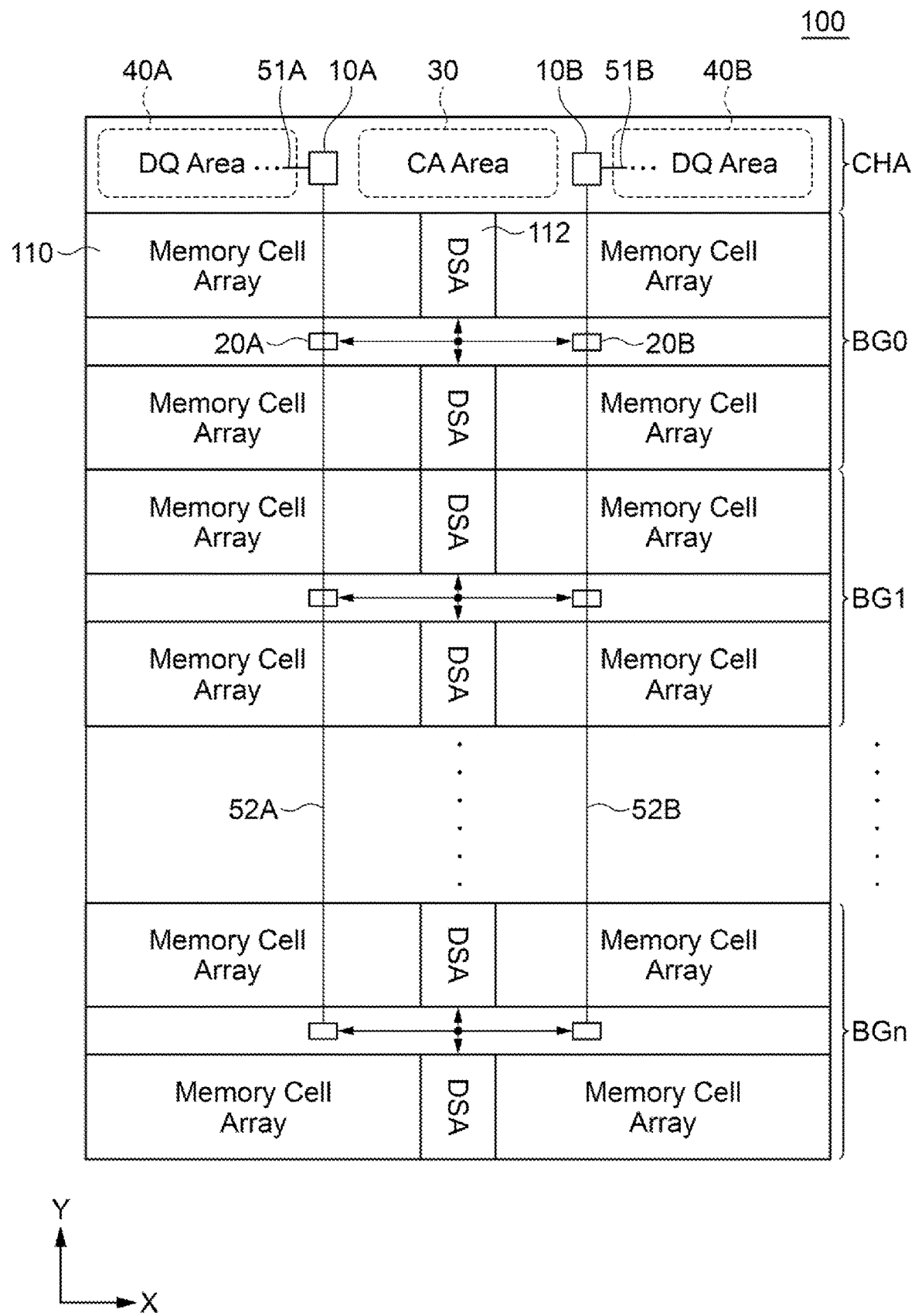
FIG. 1 is a schematic plan view showing a configuration of a semiconductor memory device according to one embodiment of the present disclosure.

FIG. 1 is a schematic plan view showing a configuration of a semiconductor memory device 100 according to one embodiment of the present disclosure. The semiconductor memory device 100 shown in FIG. 1 is a DRAM and includes a plurality of bank groups BG0 to BGn and a peripheral circuit area CHA. The bank groups BG0 to BGn are arrayed in a Y direction. Each of the bank groups BG0 to BGn includes a memory cell array 110, an amplifier circuit 112, and buffer circuits 20A and 20B. The peripheral circuit area CHA is arranged at an end in the Y direction. The peripheral circuit area CHA includes a command address circuit area 30 and data I/O circuit areas 40A and 40B. A command address terminal to which a command address signal is input, a decoder circuit that decodes the command address signal, a control circuit that generates various control signals on the basis of the command address signal, a calibration circuit, and the like are arranged in the command address circuit area 30. A data terminal to and from which data is input and output, an I/O circuit, and the like are arranged in each of the data I/O circuit areas 40A and 40B. Buffer circuits 10A and 10B are allocated to the data I/O circuit areas 40A and 40B, respectively. The buffer circuit 10A is coupled to the I/O circuit included in the data I/O circuit area 40A via a data bus 51A and is coupled to the buffer circuits 20A included in the bank groups BG0 to BGn via a data bus 52A. The buffer circuit 10B is coupled to the I/O circuit included in the data I/O circuit area 40B via a data bus 51B and is coupled to the buffer circuits 20B included in the bank groups BG0 to BGn via a data bus 52B. The data buses 51A and 51B extend mainly in an X direction. The data buses 52A and 52B extend mainly in the Y direction.

At the time of a read operation, read data that is read from any of the memory cell arrays 110 is transferred to the data bus 52A or 52B via the buffer circuit 20A or 20B in an associated one of the buffer groups BG0 to BGn and is further transferred to the data I/O circuit area 40A or 40B via the buffer circuit 10A or 10B and the data bus 51A or 51B. At the time of a write operation, write data that is input to the data I/O circuit area 40A or 40B is transferred to the data bus 52A or 52B via the data bus 51A or 51B and the buffer circuit 10A or 10B and is further transferred to one of the memory cell arrays 110 via the buffer circuit 20A or 20B included in an associated one of the bank groups BG0 to BGn.

Figure 2:
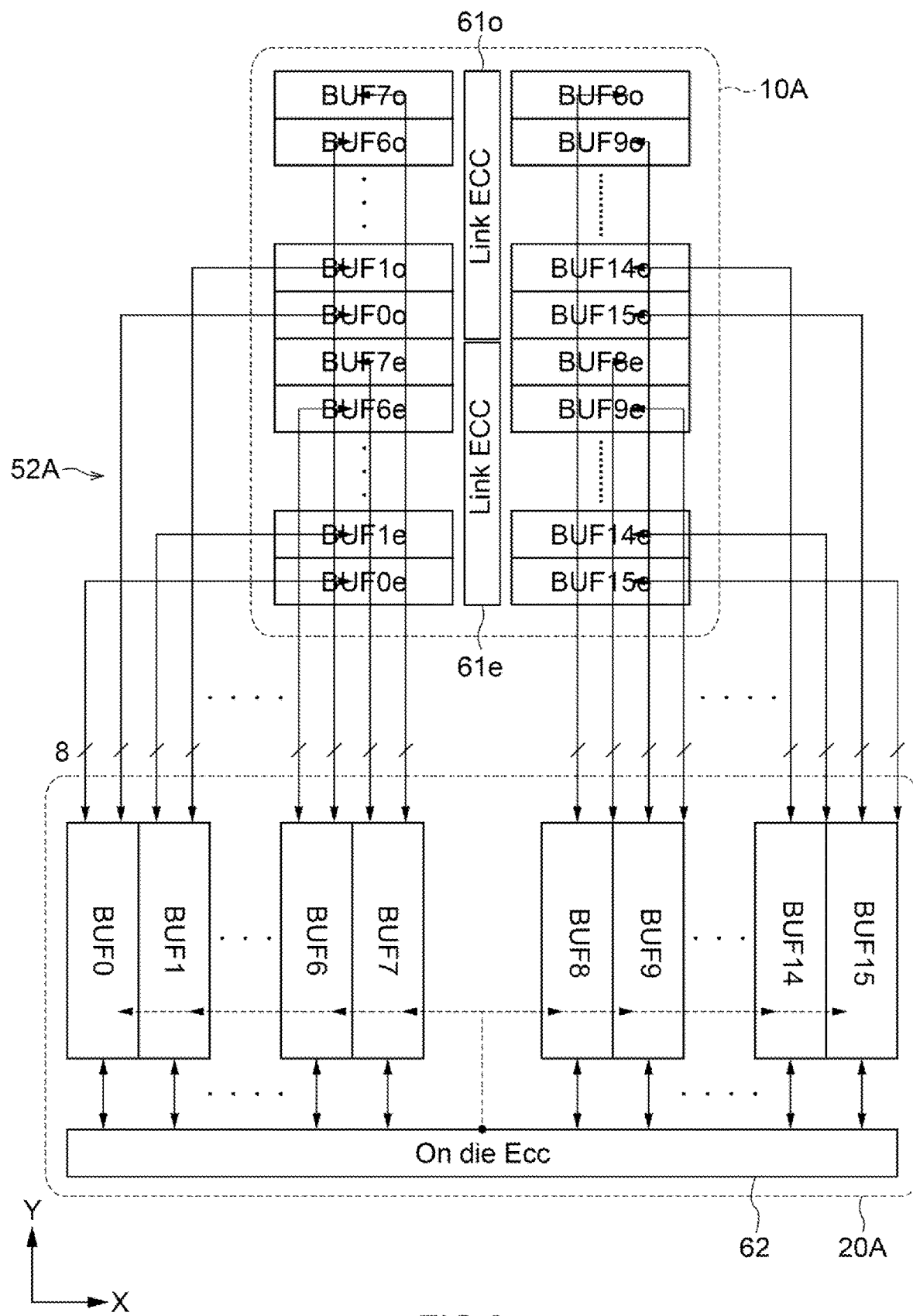
FIG. 2 is a schematic diagram for explaining a circuit configuration of buffer circuits and a connection relation therebetween.

FIG. 2 is a schematic diagram for explaining a circuit configuration of the buffer circuits 10A and 20A and a connection relation therebetween. As shown in FIG. 2, the buffer circuit 20A includes 16 unit buffer circuits BUF0 to BUF15 arrayed in the X direction, and a control circuit 62. Different addresses are allocated to the unit buffer circuits BUF0 to BUF15, respectively. The control circuit 62 controls operations of the unit buffer circuits BUF0 to BUF15 and corrects errors in data. That is, when an error occurs in data supplied to the unit buffer circuits BUF0 to BUF15, the error is corrected by an error correction circuit (On die ECC) included in the control circuit 62. Eight-bit data is allocated to each of the unit buffer circuits BUF0 to BUF15. In this case, the number of bits of data input or output at one time via the buffer circuit 20A is 128.

The buffer circuit 10A includes 16 unit buffer circuits BUF0o to BUF15o constituting the ODD buffer circuit, 16 unit buffer circuits BUF0e to BUF15e constituting the EVEN buffer circuit, and control circuits 61o and 61e. The size of the buffer circuit 10A in the X direction is smaller than that of the buffer circuit 20A in the X direction. Accordingly, the buffer circuit 20A has a part overlapping the buffer circuit 10A in the Y direction and a part not overlapping the buffer circuit 10A in the Y direction. The control circuits 61o and 61e control operations of the unit buffer circuits BUF0o to BUF15o and the unit buffer circuits BUF0e to BUF15e, respectively. An error correction circuit (Link ECC) is included in each of the control circuits 61o and 61e. Accordingly, an error is corrected by the error correction circuit included in the control circuit 61o when the error occurs in data supplied to the unit buffer circuits BUF0o to BUF15o, and an error is corrected by the error correction circuit included in the control circuit 61e when the error occurs in data supplied to the unit buffer circuits BUF0e to BUF15e.

The ODD buffer circuit and the EVEN buffer circuit are provided in one embodiment of the present disclosure. For example, the ODD buffer circuit can be associated with odd-numbered bank groups and the EVEN buffer circuit can be associated with even-numbered bank groups. Alternatively, the ODD buffer circuit and the EVEN buffer circuit may be associated with odd-numbered banks and even-numbered banks in bank groups, respectively, or may be associated with odd-numbered column addresses and even-numbered column addresses in banks, respectively. When one of the groups or addresses is selected, the ODD or EVEN buffer circuit associated therewith is used. When the ODD buffer circuit is to be used, the unit buffer circuits BUF0o to BUF15o are selected and data transfer to and from the unit buffer circuits BUF0 to BUF15 included in each of the buffer circuits 20A is performed via the data bus 52A. When the EVEN buffer circuit is to be used, the unit buffer circuits BUF0e to BUF15e are selected and data transfer to and from the unit buffer circuit BUF0 to BUF15 included in each of the buffer circuits 20A is performed via the data bus 52A.

Figure 3:
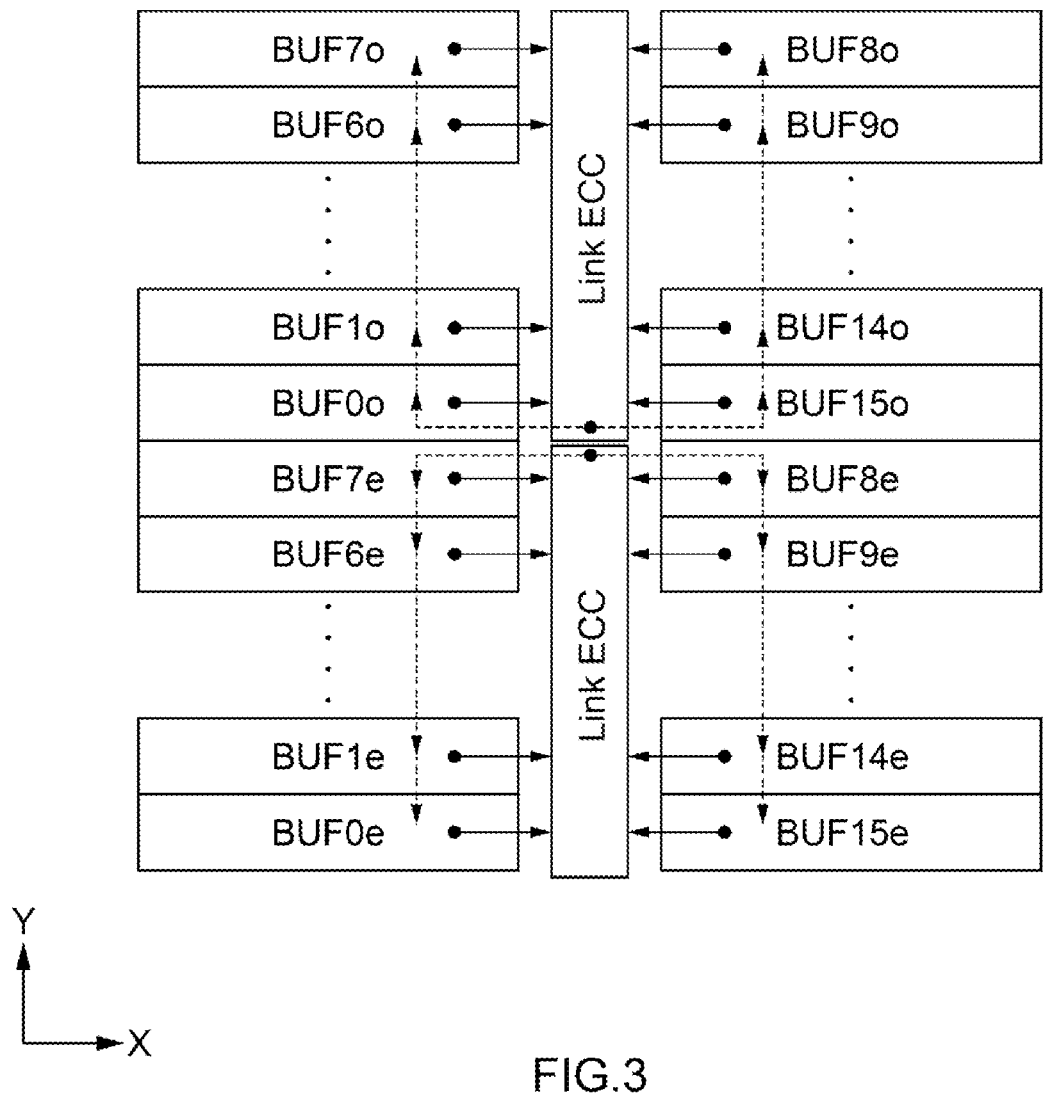
FIG. 3 is a schematic diagram for explaining a connection relation between unit buffer circuits and a control circuit.

The unit buffer circuits BUF0e to BUF7e and the unit buffer circuit BUF0o to BUF7o are arrayed in this order in the Y direction. The unit buffer circuits BUF15e to BUF8e and the unit buffer circuits BUF15o to BUF8o are arrayed in this order in the Y direction. The unit buffer circuits BUF0e to BUF7e and the unit buffer circuits BUF15e to BUF8e are arrayed in the X direction and the control circuit 61e is arranged therebetween. Similarly, the unit buffer circuits BUF0o to BUF7o and the unit buffer circuits BUF15o to BUF8o are arrayed in the X direction and the control circuit 61o is arranged therebetween. The control circuit 61e and the control circuit 61o are next to each other in the Y direction. With this layout, the wiring length of lines that connect the unit buffer circuits BUF0e to BUF15e to the control circuit 61e can be shortened and the area occupied by the control circuit 61e can be reduced as illustrated in FIG. 3. Similarly, the wiring length of lines that connect the unit buffer circuits BUF0o to BUF15o to the control circuit 61o can be shortened and the area occupied by the control circuit 61o can be reduced.

In the example shown in FIG. 2, the unit buffer circuits BUF0e and BUF15e are closest to the buffer circuit 20A and the unit buffer circuits BUF7e and BUF8e are farthest from the buffer circuit 20A among the unit buffer circuits BUF0e to BUF15e. Meanwhile, the unit buffer circuits BUF0 and BUF15 are located at both ends in the X direction, respectively, and the unit buffer circuits BUF7 and BUF8 are arranged in a substantial central portion in the X direction in the buffer circuit 20A. Particularly, the unit buffer circuit BUF7 has an overlap with the unit buffer circuits BUF0e to BUF7e in the Y direction and the unit buffer circuit BUF8 has an overlap with the unit buffer circuits BUF8e to BUF15e in the Y direction. In contrast thereto, the unit buffer circuits BUF0 and BUF15 are located at the both ends in the X direction and accordingly do not have an overlap with the unit buffer circuits BUF0e to BUF15e in the Y direction. With this layout, ones of the unit buffer circuits BUF0 to BUF15 included in the buffer circuit 20A and arranged at locations closer to the ends in the X direction are farther from the buffer circuit 10A. However, in the layout shown in FIG. 2, the unit buffer circuits BUF0e and BUF15e corresponding to the unit buffer circuits BUF0 and BUF15 farthest from the buffer circuit 10A are arranged on a side closer to the buffer circuit 20A, and the unit buffer circuits BUF7e and BUF8e corresponding to the unit buffer circuits BUF7 and BUF8 closest to the buffer circuit 10A are arranged on a side farther from the buffer circuit 20A. Therefore, differences in the wiring length of the data bus 52A among the unit buffer circuits can be decreased. The same holds true for the ODD buffer circuit.

Figure 4:
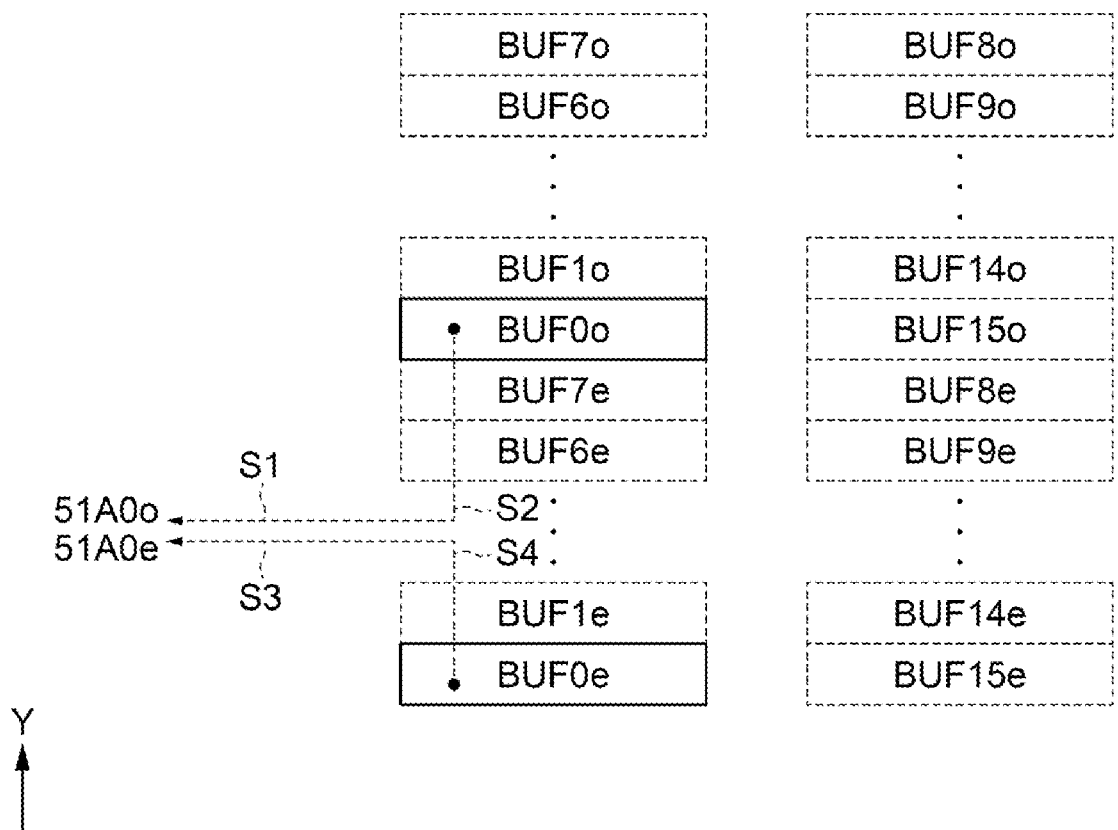
FIG. 4 is a schematic diagram for explaining a connection relation between unit buffer circuits and data buses.

Furthermore, it is preferable that the data bus 51A that connects the buffer circuit 10A to the I/O circuit included in the data I/O circuit area 40A are arranged so as to equalize the wiring distance on the ODD side and the wiring distance on the EVEN side. That is, in a case where a data bus 51A0o coupled to the unit buffer circuit BUF0o and a data bus 51A0e coupled to the unit buffer circuit BUF0e are laid out in the vicinity as shown in FIG. 4, the data bus 51A0o is constituted of a section S1 extending in the X direction and a section S2 extending in the Y direction, and the data bus 51A0e is constituted of a section S3 extending in the X direction and a section S4 extending in the Y direction. It is preferable that the lengths of the section S2 and the section S4 are equal to each other. When the section S2 is extended in the Y direction toward the unit buffer circuit BUF0o and the section S4 is extended in the Y direction toward the unit buffer circuit BUF0e, the wiring distances of the data bus 51A0e and 51A0o are substantially equal to each other because the sections S1 and S3 are located between the unit buffer circuit BUF0o and the unit buffer circuit BUF0e. The same holds true for the data bus 51B that connects the buffer circuit 10B to the I/O circuit included in the data I/O circuit area 40B.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a first memory group including a plurality of first memory cells;
a second memory group including a plurality of second memory cells;
a first buffer circuit configured to receive a plurality of first data bits from the first memory group, the first buffer circuit including a plurality of first circuits grouped into first and second buffer groups;
a second buffer circuit configured to receive a plurality of second data bits from the second memory group, the second buffer circuit including a plurality of second circuits grouped into third and fourth buffer groups;
a first error correction circuit configured to correct at least one of the plurality of first data bits; and
a second error correction circuit configured to correct at least one of the plurality of second data bits,
wherein the first error correction circuit is arranged between the first and second buffer groups of the first buffer circuit in physical layout; and wherein the second error correction circuit is arranged between the third and fourth buffer groups of the second buffer circuit in physical layout.

2. The apparatus of claim 1,
wherein the first and second buffer groups and the first error correction circuit are arranged in a first direction in physical layout,
wherein the third and fourth buffer groups and the second error correction circuit are arranged in the first direction in physical layout,
wherein the first and third buffer groups are arranged in a second direction perpendicular to the first direction,
wherein the second and fourth buffer groups are arranged in the second direction, and
wherein the first and second error correction circuits are arranged in the second direction.

3. The apparatus of claim 2,
wherein the first circuits included in the first buffer group are arranged in the second direction,
wherein the first circuits included in the second buffer group are arranged in the second direction,
wherein the second circuits included in the third buffer group are arranged in the second direction, and
wherein the second circuits included in the fourth buffer group are arranged in the second direction.

4. The apparatus of claim 3, further comprising a third buffer circuit including a plurality of third circuits,
wherein the first and second buffer circuits and the third buffer circuit are arranged in the second direction,
wherein the plurality of third circuits is arranged in the first direction, and
wherein each of the plurality of third circuits is coupled to an associated one of the plurality of first circuits and an associated one of the plurality of second circuits.

5. The apparatus of claim 4, wherein the third buffer circuit is greater in width in the first direction than the first and second buffer circuits.

6. The apparatus of claim 5, wherein one of the plurality of third circuits located at one end in the first direction is coupled to a closest one of the plurality of first circuits to the third buffer circuit.

7. The apparatus of claim 6, wherein the one of the plurality of third circuits does not overlap the first and second buffer circuits in the second direction.

8. The apparatus of claim 4, further comprising a third error correction circuit configured to correct data supplied to the plurality of third circuits,
wherein the third buffer circuit and the third error correction circuit are arranged in the second direction.

9. The apparatus of claim 4, further comprising an I/O circuit coupled to the first and second buffer circuits,
wherein the I/O circuit and the first and second buffer circuits are arranged in the first direction.

10. An apparatus comprising:
a first memory group including a plurality of first memory cells;
a second memory group including a plurality of second memory cells;
a first buffer circuit including a plurality of first circuits, a plurality of second circuits, a first control circuit configured to control the plurality of first circuits, and a second control circuit configured to control the plurality of second circuits;
an I/O circuit coupled to the first buffer circuit via a plurality of first data buses extending in a first direction; and a second buffer circuit coupled to the first buffer circuit via a plurality of second data buses extending in a second direction perpendicular to the first direction,
wherein the plurality of first circuits is configured to be activated when one of the plurality of first memory cells is selected,
wherein the plurality of second circuits is configured to be activated when one of the plurality of second memory cells is selected,
wherein the plurality of first circuits are located in a first region,
wherein the plurality of second circuits are located in a second region adjacent to the first region in the second direction,
wherein the first control circuit is located in a third region adjacent to the first region in the first direction, and
wherein the second control circuit is located in a fourth region adjacent to the second region in the first direction.

11. The apparatus of claim 10,
wherein the plurality of first circuits are arranged in the second direction on the first region, and
wherein the plurality of second circuits are arranged in the second direction on the second region.

12. The apparatus of claim 11,
wherein the first buffer circuit further includes a plurality of third circuits configured to be controlled by the first control circuit and a plurality of fourth circuits configured to be controlled by the second control circuit,
wherein the plurality of first and third circuits are configured to be activated when one of the plurality of first memory cells is selected,
wherein the plurality of second and fourth circuits are configured to be activated when one of the plurality of second memory cells is selected,
wherein the plurality of third circuits are located in a fifth region,
wherein the plurality of fourth circuits are located in a sixth region,
wherein the third region is sandwiched between the first and fifth regions in the first direction, and
wherein the fourth region is sandwiched between the second and sixth regions in the first direction.

13. The apparatus of claim 12,
wherein the first control circuit includes a first error correction circuit configured to correct data supplied to the plurality of first and third circuits, and
wherein the second control circuit includes a second error correction circuit configured to correct data supplied to the plurality of second and fourth circuits.

14. The apparatus of claim 11,
wherein the second buffer circuit includes a plurality of fifth circuits, and
wherein each of the plurality of fifth circuits is coupled to an associated one of the plurality of first circuits and an associated one of the plurality of second circuits.

15. The apparatus of claim 14, wherein the plurality of fifth circuits are arranged in the first direction.

16. The apparatus of claim 15,
wherein a first one of the plurality of fifth circuits overlaps the first buffer circuit in the second direction,
wherein a second one of the plurality of fifth circuits does not overlap the first buffer circuit in the second direction,
wherein the first one of the plurality of fifth circuits is coupled to a first one of the plurality of first circuits and a first one of the plurality of second circuits, wherein the second one of the plurality of fifth circuits is coupled to a second one of the plurality of first circuits and a second one of the plurality of second circuits, wherein the first one of the plurality of first circuits is farther than the second one of the plurality of first circuits from the second buffer circuit in the second direction, and wherein the first one of the plurality of second circuits is farther than the second one of the plurality of second circuits from the second buffer circuit in the second direction.

17. The apparatus of claim 14, wherein a first one of the plurality of first circuits and a first one of the plurality of second circuits are coupled in common to a first one of the plurality of fifth circuits, wherein the plurality of first data buses includes a first bus coupled to the first one of the plurality of first circuits and a second bus coupled to the first one of the plurality of second circuits, and wherein a part of the first and second buses are arranged between the first one of the plurality of first circuits and the first one of the plurality of second circuits.

18. The apparatus of claim 17, wherein the part of the first bus includes a first section extending in the first direction and a second section extending in the second direction connecting the first section to the first one of the plurality of first circuits, wherein the part of the second bus includes a third section extending in the first direction and a fourth section extending in the second direction connecting the third section to the first one of the plurality of second circuits, and wherein the second section and the fourth section have substantially the same lengths as each other.

19. An apparatus comprising:

a plurality of first buffer circuits arranged in a first direction on a first region;

a plurality of second buffer circuits arranged in the first direction on a second region;

a plurality of third buffer circuits arranged in the first direction on a third region;

a plurality of fourth buffer circuits arranged in the first direction on a fourth region;

a plurality of fifth buffer circuits arranged in a second direction perpendicular to the first direction on a fifth region;

a plurality of sixth buffer circuits arranged in the second direction on a sixth region;

a first control circuit configured to control the plurality of first and second buffer circuits; and a second control circuit configured to control the plurality of third and fourth buffer circuits, wherein the first control circuit is arranged between the plurality of first buffer circuits and the plurality of second buffer circuits in the second direction, wherein the second control circuit is arranged between the plurality of third buffer circuits and the plurality of fourth buffer circuits in the second direction, wherein the plurality of first buffer circuits and the plurality of third buffer circuits are arranged in the first direction, wherein the plurality of second buffer circuits and the plurality of fourth buffer circuits are arranged in the first direction, wherein each of the plurality of fifth buffer circuits is coupled to an associated one of the plurality of first buffer circuits and an associated one of the plurality of third buffer circuits, and wherein each of the plurality of sixth buffer circuits is coupled to an associated one of the plurality of second buffer circuits and an associated one of the plurality of fourth buffer circuits.

20. The apparatus of claim 19, wherein some of the plurality of fifth buffer circuits overlap the plurality of first and third buffer circuits in the first direction, wherein some of the plurality of sixth buffer circuits overlap the plurality of second and fourth buffer circuits in the first direction, and wherein remaining ones of the plurality of fifth and sixth buffer circuits do not overlap the plurality of first, second, third, and fourth buffer circuits in the first direction.

* * * * *